US007439756B2

(12) United States Patent
Lai

(10) Patent No.: US 7,439,756 B2
(45) Date of Patent: Oct. 21, 2008

(54) TESTING CIRCUIT AND TESTING METHOD FOR LIQUID CRYSTAL DISPLAY DEVICE

(75) Inventor: Ming-Sheng Lai, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 11/284,830

(22) Filed: Nov. 23, 2005

(65) Prior Publication Data

US 2006/0279322 A1 Dec. 14, 2006

(30) Foreign Application Priority Data

Jun. 10, 2005 (TW) .............................. 94119416 A

(51) Int. Cl.
*G01R 31/00* (2006.01)

(52) U.S. Cl. ...................................................... 324/770

(58) Field of Classification Search ....................... None
See application file for complete search history.

(56) References Cited

U.S. PATENT DOCUMENTS 6,392,719 B2 * 5/2002 Kim ............................ 349/40
6,982,569 B2 * 1/2006 Lee et al. .................... 324/770
2002/0047820 A1 * 4/2002 Ha .............................. 345/87
2002/0089614 A1 * 7/2002 Kim ............................ 349/40

* cited by examiner

*Primary Examiner*—Minh N Tang
(74) *Attorney, Agent, or Firm*—Rosenberg, Klein & Lee

(57) ABSTRACT

A testing circuit and a test method for a liquid crystal display device are provided. The testing circuit for the liquid crystal display device employs p shorting bars to test subpixels of pixel cells formed on a substrate. The p shorting bars are respectively connected to (p×m+1)th, (p×m+2)th, (p×m+3)th . . . , (p×m+p)th numbered signal paths of the plurality of the signal paths, and when n is odd, p=2×n; when n is even, p=n; with m being zero or a positive integer.

9 Claims, 8 Drawing Sheets

TESTING CIRCUIT AND TESTING METHOD FOR LIQUID CRYSTAL DISPLAY DEVICE

FIELD OF THE INVENTION

The present invention relates to a testing circuit and a method for liquid crystal display device, in particular a testing circuit and a method for liquid crystal display device by grouping signal paths according to the number of pixels.

BACKGROUND OF THE INVENTION

In the front end of manufacturing liquid crystal display (LCD) devices, millions of thin film transistors (TFT), usually formed on a substrate using epitaxial method, control pixels on the displaying structure wherein the substrate can be a glass substrate, a flexible substrate or a silicon substrate. Dark points or luminous points, i.e. defective display pixels, are shown if a portion of the TFT transistors do not function well due to the defects created during the manufacturing process. These defective pixels downgrade the quality of TFT display devices substantially and become an important objective of the TFT transistor testing.

Referred to FIG. 1, it is a diagram of a testing circuit of an LCD in prior art, comprising, formed on a substrate, a plurality of signal paths 11 in parallel and a plurality of gate signal paths 12 in parallel. It further comprises a TFT transistor at the cross point of the signal paths 11 and gate signal paths 12 acting as a control unit of the pixel 131 of the pixel cell 13. The pixel cell 13 usually contains three pixels 131, each corresponding to red (R), green (G), and blue (B) colors, showing colors by mixing these three colors according to an appropriate ratio of the strengths of these primary three colors. Furthermore, testing equipments can test the LCD by coupling probes with testing pads 111 of signal paths 11 and with testing pads 121 of gate signal paths 12.

While testing the characteristics of a specific TFT transistor, it is often to couple the testing pads 111 of signal paths 11 of the specific TFT transistor with a first testing probe of the testing equipment and couple the testing pads 121 of gate signal paths 12 of the specific TFT transistor with a second testing probe of the testing equipment. The testing equipment sends testing signals through the first testing probe, second testing probe, signal paths 11 and gate signal paths 12 into the specific TFT transistor for verifying the characteristics and quality with normal standards.

The testing method mentioned above needs a long testing time because it requires time to move the two testing probes to attach on each pair of specific testing pads 111, 121. Although the time can be reduced by increasing the number of testing probes of the testing equipment, it is still not a practicable method while considering the raising cost.

Referred to FIG. 2, it is a diagram of another testing circuit of an LCD in prior art providing another method to solve the problem occurred in the testing circuit described in FIG. 1 wherein a shorting bar 21 is connected to all of the signal paths 11 and a gate shorting bar 22 is connected to all of the gate signal paths 12. A testing pad 211 connected to one terminal of the shorting bar 21 and a testing pad 221 connected to one terminal of the gate shorting bar 22 are utilized for coupling with the testing probes of the testing equipment. During the testing process, after coupling a first testing probe of the testing equipment with the testing pad 211 of the shorting bar 21 and coupling a second testing probe of the testing equipment with the testing pad 221 of the gate shorting bar 22, the testing equipment sends testing signals by the first testing probe and the second testing probe through the shorting bar 21 and the gate shorting bar 22 into all of the TFT transistors. By driving the TFT transistors on the LCD panel further converts the testing signals to light signals. If there were portions of TFT transistors not being driven successfully result from defects during manufacturing process, the optical inspecting system of the testing equipment can screen them out and save the testing time apparently. The manufacturing process is completed after the shorting bar 21 and the gate shorting bar 22 is further dismembered from signal paths 11 and signal paths 12.

The method mentioned above still can not screen out the defects due to the short defects created during manufacturing process of any two adjacent signal paths among signal paths 11 or signal paths 12. This problem can be solved by dividing the signal paths 11 and gate signal paths 12 into several groups and connecting each group to corresponding shorting bar.

Referred to FIG. 3, it is a diagram of further one testing circuit of an LCD in prior art. The testing circuit in FIG. 3 is usually called 2G2D testing circuit, i.e. 2 gates and 2 drains, for solving the problem not able to inspect the short defects between any two adjacent signal paths among signal paths 11 or signal paths 12. The testing circuit in FIG. 3 comprises a plurality of signal paths 11; a plurality of gate signal paths 12; two shorting bars 31 each connected to odd number signal paths 32 and even number signal paths 33; two gate shorting bars 34 each connected to odd number signal paths 35 and even number signal paths 36. Testing pads 311, 341 for coupling with the testing probes of the equipment are connected to shorting bars 31 and gate shorting bars 34 respectively. While testing, the testing equipment sends testing signals through the shorting bars 31 and the gate shorting bars 34 into preferred portions of TFT transistors by coupling multiple testing probes with corresponding testing pads 311, 341. Within this method, any two adjacent signal paths among signal paths 11 or gate signal paths 12 are connected to different groups of shorting bars, and any short defects between any two adjacent signal paths can be screened out.

There are often short defects between two adjacent signal paths during the manufacturing process of array cells. The testing method in FIG. 3 is an effective way to screen out those short defects between two adjacent signal paths but only suitable for the array testing of LCD devices. During the manufacturing process of liquid crystal cells, color filters are coupled with the substrate and liquid crystal molecules are injected into the substrate. Thus, the testing signals are converted through the liquid crystal cells into light signals and further into light with red, green or blue color corresponding to the three pixels of a liquid crystal cell. Normally, a liquid crystal cell contains three pixels with three primary colors including red, green and blue color and produces images by controlling the light intensities of these three pixels to create desirable colors like purple, yellow, cyan etc. While testing the LCD devices after the step of manufacturing liquid crystal cells, the most effective way for inspecting the LCD devices is to first divide the pixels with color filters into groups according to their primary colors of a liquid crystal cell. The sequential number of the signal paths can be divided into three groups corresponding to three primary colors and thus connected to the corresponding shorting bar.

Referred to FIG. 4, it is a diagram of further another testing circuit of an LCD in prior art. The testing circuit in FIG. 4 is to improve the testing efficiency of liquid crystal cells of LCD devices and is usually called 2G3D testing circuit, i.e. 2 gates and 3 drains, comprising a plurality of signal paths 11 on a substrate; a plurality of signal paths 12 on the substrate; three shorting bars 41 on the substrate wherein each one of the three shorting bars is connected to the (3m+1)th signal path 42, (3m+2)th signal path 43, (3m+3)th signal path 44 where m is an positive integral number or zero. It is equal to divide the signal paths into three groups and connected to shorting bars 41 wherein the 1, 4, 7, . . . signal path a signal path group 42; the 2, 5, 8, . . . signal path a signal path group 43; and the 3, 6, 9, . . . signal path a signal path group 44. The testing circuit further comprises two gate shorting bars 34 on the substrate wherein each gate shorting bar is connected to odd number gate signal path 35 and even number gate signal path 36. Furthermore, testing pads 411, 341 are connected to one end of the corresponding shorting bars 41 and one end of gate shorting bars 34 for coupling with the testing probes of testing equipments. While testing, testing equipments send testing signals into specific TFT transistors through the shorting bars 41 and gate shorting bars 34 by coupling a plurality of testing probes with a plurality of corresponding testing pads 411, 341. In this testing method, the signal paths 11 are already divided into three groups corresponding to their primary color, and can improve the testing performance by inputting testing signals into specific shorting bars 41 and then inspecting the primary color shown on the specific pixels connected to the specific shorting bars 41. This method is suitable for testing pixels at the step after completing the manufacturing process of liquid crystal cells. However, the disadvantage of this method is that the testing time is obviously increased for including the short defects examination of any two adjacent signal paths 11. The short defects examination of any two adjacent signal paths 11 is to test all possible combinations of any two signal paths selected from the (3m+1)th signal path 42, (3m+2)th signal path 43, and (3m+3)th signal path 44.

As mentioned above, neither of the testing efficiency of array testing or the testing efficiency of liquid crystal cell testing can be improved simultaneously no matter the testing circuit of an LCD in FIG. 3 or the testing circuit of an LCD in FIG. 4 is applied. The testing efficiency of liquid crystal cell testing decreases by applying the testing circuit in FIG. 3, and in the same way the testing efficiency of array testing reduces by applying the testing circuit in FIG. 4. In the rapid progress of LCD industry, the competitive ability includes avoiding the increasing testing time and delaying shipping schedule due to inappropriate testing methods. The competitive ability is further strengthened by providing a solution to solve the testing problems mentioned above.

Therefore, it is an object of the present invention to provide one testing circuit by including additional shorting bars whose number is multiple of the number of pixels in a liquid crystal cell. The problems of the testing efficiency in steps at array testing and at liquid crystal cell testing can be both improved effectively according to the present invention.

SUMMARY OF THE INVENTION

The present invention provides a testing circuit, comprising a substrate; a plurality of pixel cells on the substrate wherein each pixel cell contains n number pixels; a plurality of signal paths on the substrate connecting to the corresponding pixels; p number of shorting bars on the substrate connecting to (p×m+1)th, (p×m+2)th, (p×m+3)th . . . , (p×m+p)th signal path; where p=2×n while n is an odd integral number and p=n while n is an even number, and m is zero or positive integral number.

In one aspect of the present invention, there is provided a testing circuit of an LCD utilizing the testing circuit mentioned above. The p shorting bars are divided into groups by the base number n wherein testing signals are sent into each group of shorting bars respectively. The p shorting bars can also be divided into groups by number 2 wherein testing signals are sent into each group of shorting bars respectively.

For example, if n equals to an odd number 3, then the number of shorting bars will be 6 (p=2×3) wherein each of them connects to (6×m+1)th, (6×m+2)th, (6×m+3)th . . . , (6×m+6)th signal path respectively. While testing on the liquid crystal cells during the manufacturing process of an LCD, these 6 shorting bars can be divided into groups based on number 3 which means the first and the forth shorting bars are in a group; the second and the fifth shorting bars are in another group; and the third and sixth shorting bars are in one another group. Thus, testing signals can be sent into the shorting bars belonged to the corresponding group. The inspection can be implemented based on the primary colors because the shorting bars are divided into groups according to the primary colors equal to the number of pixels in a liquid crystal cell. It is an effective way to implement the liquid crystal cells testing. While doing the array testing, testing signals are sent into two groups of shorting bars wherein one of the groups comprises the odd number of the shorting bars among these 6 shorting bars and the other of the groups comprises the even number of the shorting bars among these 6 shorting bars. In this case, the short defects between any two neighboring signal paths can be screened out.

For example, if n equals to an even number 4, then the number of shorting bars will be 4 (p=4) wherein each of them connects to (4×m+1)th, (4×m+2)th, (4×m+3)th, and (4×m+4)th signal path respectively. While testing on the liquid crystal cells during the manufacturing process of an LCD, these 4 shorting bars can be divided into groups based on number 4. Thus, testing signals can be sent into the shorting bars belonged to the corresponding group. The inspection can be implemented based on the primary colors because the shorting bars are divided into groups according to the primary colors equal to the number of pixels, i.e. number 4, in a liquid crystal cell. It is an effective way to implement the liquid crystal cells testing. While doing the array testing, testing signals are sent into two groups of shorting bars wherein one of the groups comprises the odd number of the shorting bars among these 4 shorting bars and the other of the groups comprises the even number of the shorting bars among these 4 shorting bars. In this case, the short defects between any two neighboring signal paths can be screened out.

While the present invention has been described in detail and pictorially in the accompanying drawings, it is not limited to such details since the similar methods can be implemented as efficient testing methods when the number n equals 5, 6, 7 . . . etc.

In another aspect of the present invention, there is provided a testing circuit, comprising a substrate; a plurality of pixel cells on the substrate wherein each pixel cell contains n number pixels; a plurality of signal paths on the substrate connecting to the corresponding pixels; n number of shorting bars on the substrate connecting to (n×m+1)th, (n×m+2)th, (n×m+3)th . . . , (n×m+n)th signal path respectively; where n is an odd integral number and m is zero or positive integral number.

With the advantages described above, the present invention provides a testing circuit and a method that improves both the testing efficiency of array testing and the testing efficiency of liquid crystal cells simultaneously, and thus speed up the shipping schedule. Not only make the cost down during the testing process of LCD devices but also have an elastic shipping schedule of LCD devices. The competitive ability in LCD industry is further strengthened

DETAILED DESCRIPTION OF THE PREFERRED EMBODIMENTS

The testing circuit of an LCD device according to the present invention utilizes the concept of grouping the signal paths based on the number of pixels in a pixel cell. In the following preferred embodiments, only the embodiments having the number of pixels in a pixel cell equals to number 3 and number 4 are disclosed. The embodiments with the number of pixels in a pixel cell equals to 5 or more are not described here but any one skilled in the art can implement them according to disclosure of the present invention.

Figure 1:
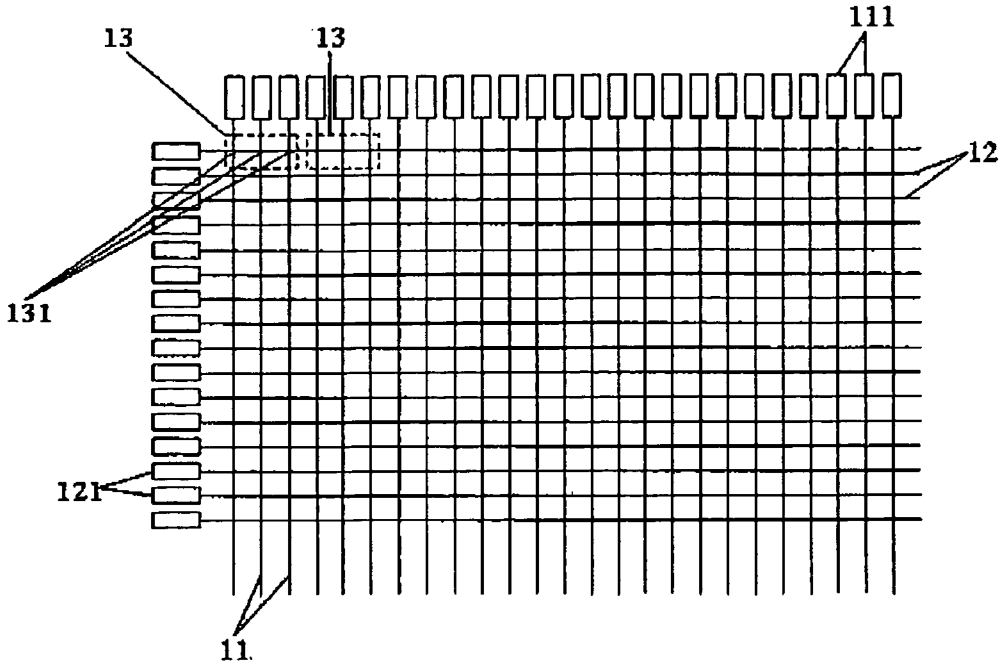
FIG. 1 PRIOR ART
FIG. 1 is a diagram of a testing circuit of an LCD in prior art.
Figure 2:
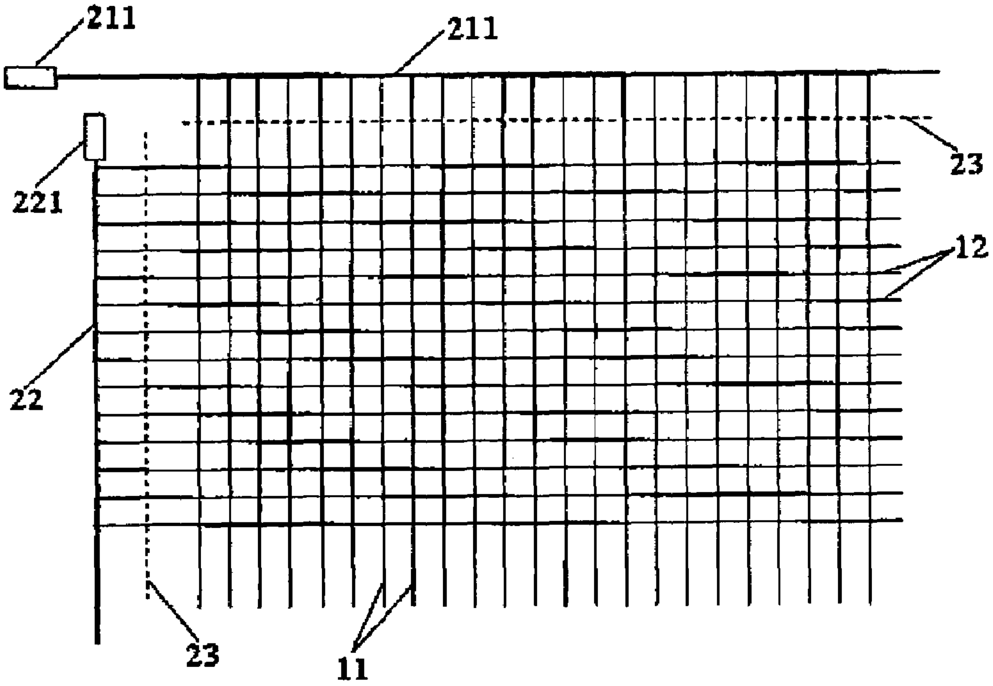
FIG. 2 PRIOR ART
FIG. 2 is a diagram of another testing circuit of an LCD in prior art.
Figure 3:
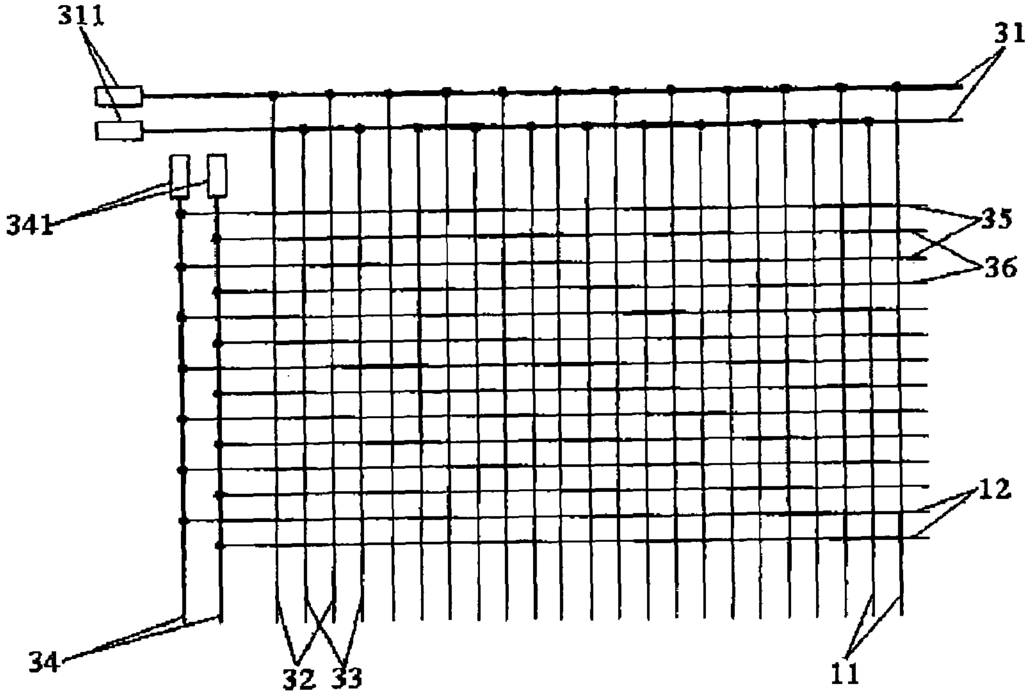
FIG 3 PRIOR ART
FIG. 3 is a diagram of further one testing circuit of an LCD in prior art.
Figure 4:
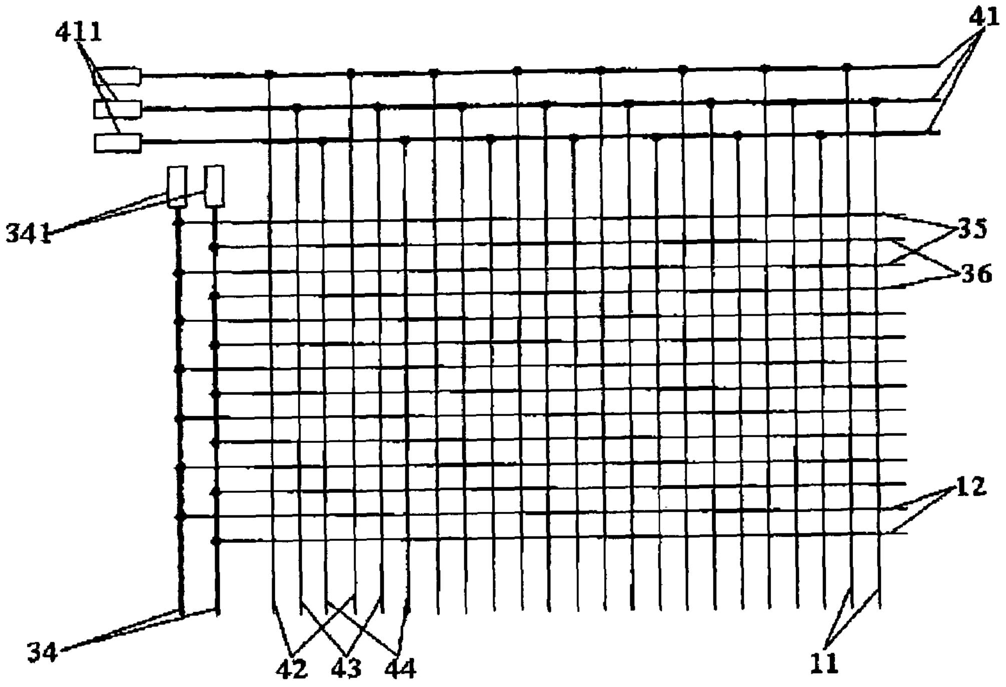
FIG. 4 PRIOR ART
FIG. 4 is a diagram of further another testing circuit of an LCD in prior art.
Figure 5:
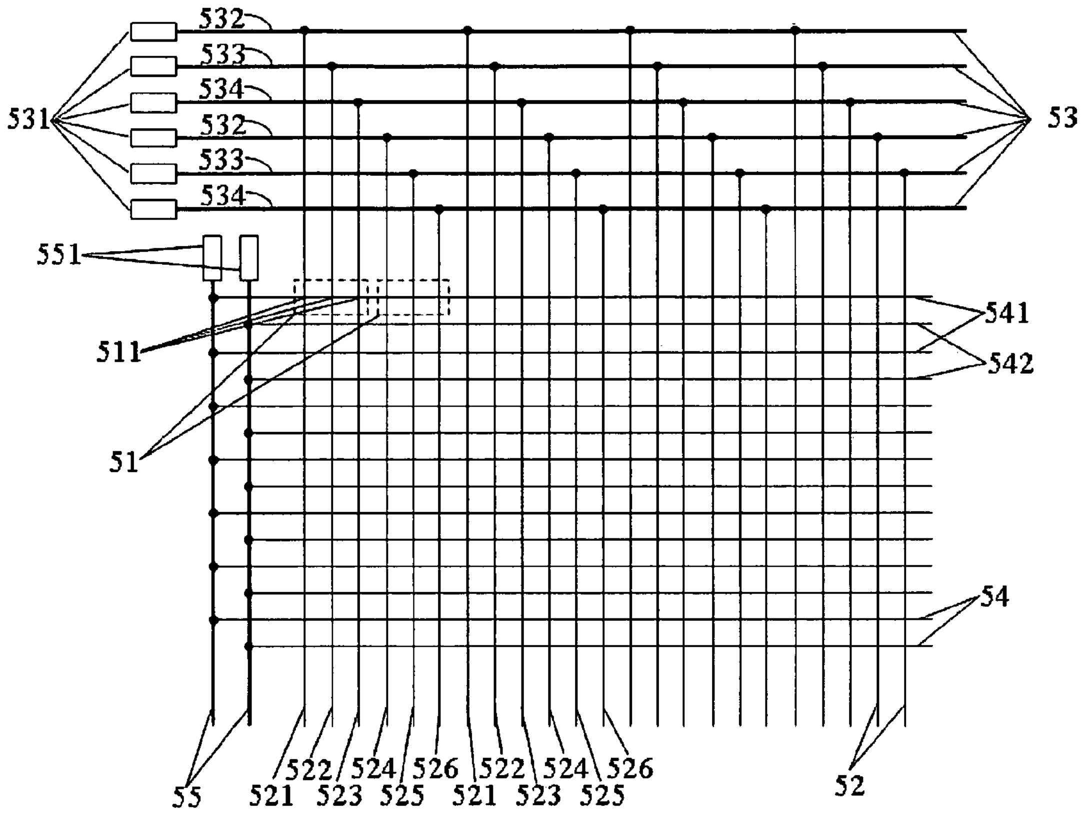
FIG. 5 is a diagram of a testing circuit of an LCD according to the present invention.

Referred to FIG. 5, it is a diagram of a testing circuit of an LCD according to the present invention. This embodiment with the number of pixels of a pixel cell equal to number 3, comprising a substrate; a plurality of pixel cells 51 on the substrate wherein each pixel cell 51 contains three pixels 511; a plurality of signal paths 52 on the substrate connecting to the corresponding pixels 511; six shorting bars 53 on the substrate connecting to (6×m+1)th 521, (6×m+2)th 522, (6×m+3)th 523, (6×m+4)th 524, (6×m+5)th 525, and (6×m+6)th 526 signal path; where m is zero or positive integral number. It's similar to divide the signal paths based on the number 6 into six groups connecting to shorting bars 53 wherein the 1st, 7th, 13th . . . , and etc. signal paths 521 are the first group; the 2nd, 8th, 14th . . . , and etc. signal paths 522 are the second group; the 3rd, 9th, 15th . . . , and etc. signal paths 523 are the third group; the 4th, 10th, 16th . . . , and etc. signal paths 524 are the fourth group; the 5th, 11th, 17th . . . , and etc. signal paths 525 are the fifth group; the 6th, 12th, 18th . . . , and etc. signal paths 526 are the sixth group. The LCD testing circuit according to the present invention further comprises a plurality of gate signal paths 54 on the substrate connecting to the corresponding pixels 511, two gate shorting bars 55 on the substrate each of them connecting to the odd number gate signal paths 541 and even number gate signal paths 542 respectively and testing pads 531, 551 for coupling with probes of testing equipments connecting to terminals of gate shorting bars 55 and terminals of shorting bars 53.

While doing the liquid crystal cells of an LCD testing, the six shorting bars 53 can be divided several groups based on number 3 which means the 1st and 4th shorting bars 532 are a group, the 2nd and 5th shorting bars 533 are another group, and the 3rd and 6th shorting bars 534 are further another group. Thus, testing signals are sent into each group of shorting bars 53 which are divided into groups based on three, the number of pixels in each pixel cell. Each of testing signals is sent into corresponding shorting bars 532, 533, 534 each connecting to same color of pixels. Finally, the inspection can be implemented by verifying the primary color emitting from pixels and provides an efficient way to carry out the testing of liquid crystal cells of an LCD. While doing the array testing of an LCD, the six shorting bars can be divided into two groups comprising one group with odd number of shorting bars and another group with even number of shorting bars. The short defects between any two neighboring signal paths can be screened out by inputting testing signals into each group of shorting bars. This provides an efficient method for array testing of an LCD.

Figure 6:
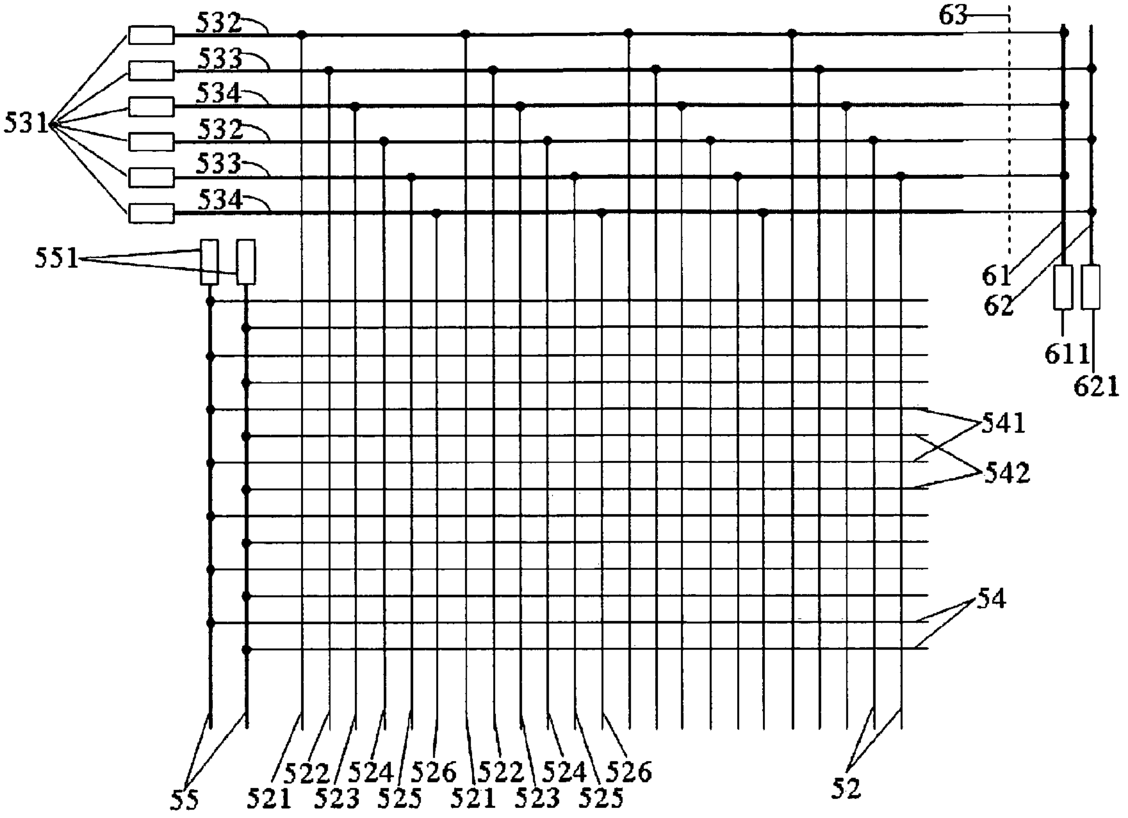
FIG. 6 is a diagram of another testing circuit of an LCD according to the FIG. 5.

Referred to FIG. 6, it is a diagram of another embodiment modified from the testing circuit in FIG. 5. The embodiment in FIG. 6 according to the present invention further comprises a first collecting shorting bar 61 and a second collecting shorting bar 62 on the substrate wherein the shorting bars 53 with odd sequential number couple with the first collecting shorting bar 61 and the shorting bars 53 with even sequential number couple with the second collecting shorting bar 62. The embodiment further comprises testing pads 611, 621, each connecting to one terminal of the first collecting shorting bar 61 and one terminal of the second collecting shorting bar 62 respectively, for coupling with the testing probes of testing equipments. The six shorting bars 53 are further divided into two groups according to the odd and even sequential number of the shorting bars. While doing the array testing, the short defects between two adjacent signal paths can be effectively inspected by inputting testing signals into the first collecting shorting bar 61 and the second collecting shorting bar 62. After completing the array testing, dissect the first collecting shorting bar 61 and the second collecting shorting bar 62 from the LCD along the dotted line 63. Thus, the liquid crystal cells testing can be the next following step of testing process.

Figure 7:
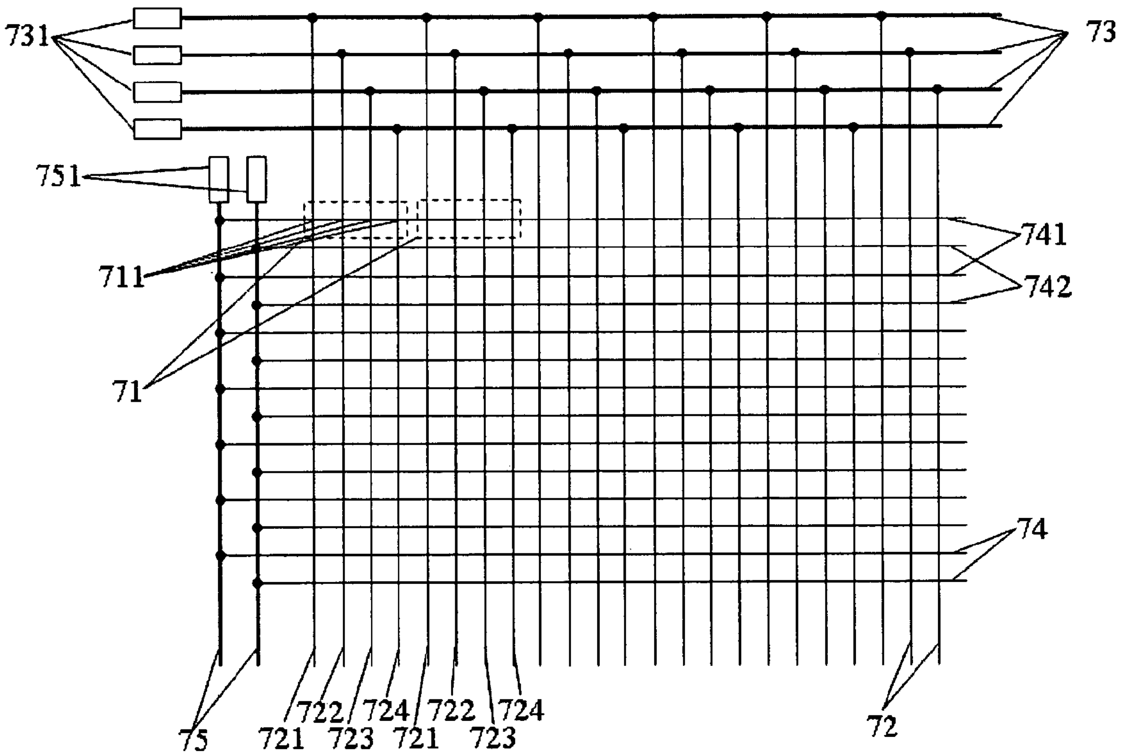
FIG. 7 is a diagram of another testing circuit of an LCD according to the present invention.

Referred to FIG. 7, it is a diagram of further another testing circuit of an LCD according to the present invention. The embodiment in which contains pixel cells with 4 pixels comprises a substrate wherein the substrate can be a glass substrate or a flexible substrate; a plurality of pixel cells 71 on the substrate wherein each pixel cell 71 contains four pixels 711; a plurality of signal paths 72 on the substrate connecting to corresponding pixels 711; four shorting bars 73 on the substrate, each of the four shorting bars 73 connects to (4×m+1)th, (4×m+2)th, (4×m+3)th, and (4×m+4)th signal path 721, 722, 723, 724 where m is a positive integer or zero. It's similar to divide the signal paths based on the number 4 into four groups connecting to shorting bars 73 wherein the 1st, 5th, 9th . . . , and etc. signal paths 721 are the first group; the 2nd, 6th, 10th . . . , and etc. signal paths 722 are the second group; the 3rd, 7th, 11th . . . , and etc. signal paths 723 are the third group; the 4th, 8th, 12th . . . , and etc. signal paths 724 are the fourth group. The LCD testing circuit according to the present invention further comprises a plurality of gate signal paths 74 on the substrate connecting to the corresponding pixels 711, two gate shorting bars 75 on the substrate each of them connecting to the odd number gate signal paths 741 and even number gate signal paths 742 respectively and testing pads 731, 751 for coupling with probes of testing equipments connecting to terminals of gate shorting bars 75 and terminals of shorting bars 73. While doing the testing, testing equipments send testing signals by coupling a plurality of testing probes with corresponding testing pads 731, 751 into shorting bars 73 and gate shorting bars 75.

While doing the liquid crystal cells of an LCD testing, the four shorting bars 73 can be divided several groups based on the number 4 which means four groups. Thus, testing signals are sent into each group of shorting bars 73 which are divided into groups based on four, the number of pixels in each pixel cell. Each of testing signals is sent into corresponding shorting bars with same color of pixels. Finally, the inspection can be implemented by verifying the primary color emitting from pixels and provides an efficient way to carry out the testing of liquid crystal cells of an LCD. While doing the array testing of an LCD, the four shorting bars can be divided into two groups comprising one group with odd number of shorting bars and another group with even number of shorting bars. The short defects between any two neighboring signal paths can be screened out by inputting testing signals into each group of shorting bars. This provides an efficient method for array testing of an LCD.

The testing circuit according to FIG. 7 can be further modified according to the embodiment in FIG. 6. The four shorting bars 73 can be connected to a first collecting shorting bar and a second collecting shorting bar according to their odd sequential number or even sequential number.

Figure 8:
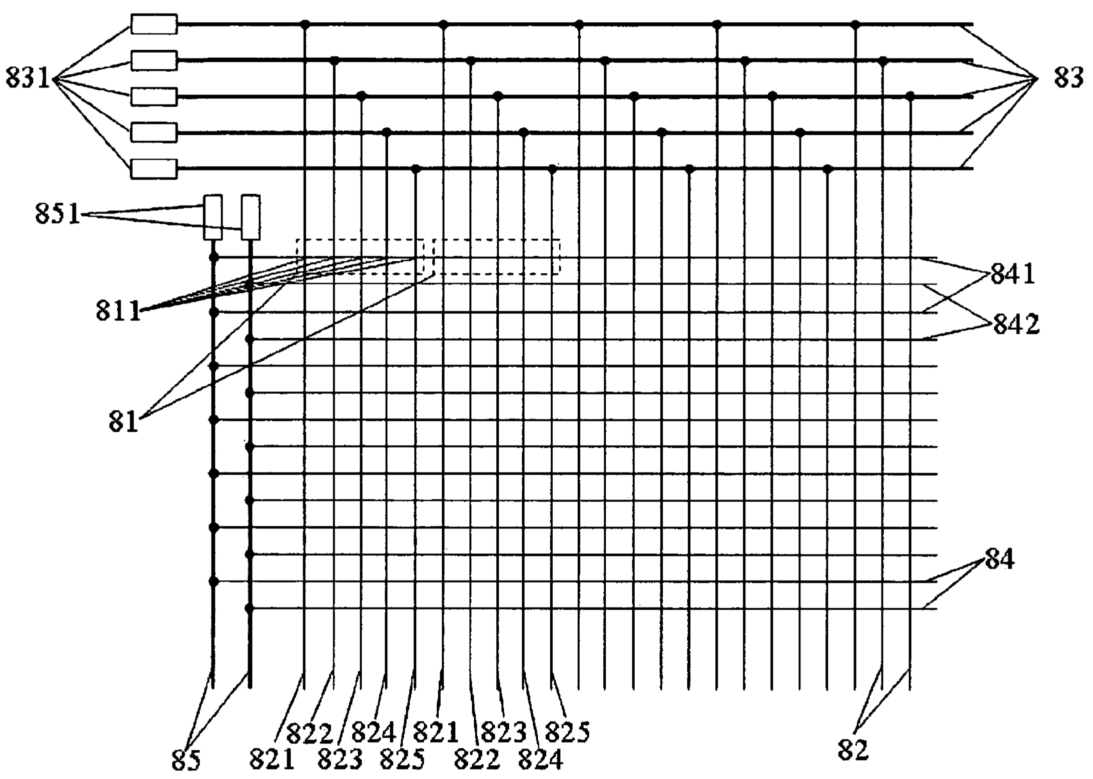
FIG. 8 is a diagram of further one testing circuit of an LCD according to the present invention.

Finally, there is still another testing circuit of an LCD with odd number pixels in a pixel cell according to the present invention. The example illustrated here is for n=5. The rule is the same for n=7, 9, 11 . . . , etc. Referred to FIG. 8, it is a diagram of an embodiment according to the present invention. The embodiment in which contains pixel cells with 5 pixels comprises a substrate wherein the substrate can be a glass substrate or a flexible substrate; a plurality of pixel cells 81 on the substrate wherein each pixel cell 81 contains five pixels 811; a plurality of signal paths 82 on the substrate connecting to corresponding pixels 811; five shorting bars 83 on the substrate, each of the five shorting bars 83 connects to (5×m+1)th, (5×m+2)th, (5×m+3)th, (5×m+4)th, and (5×m+5)th signal path 821, 822, 823, 824, 825 where m is a positive integer or zero. It's similar to divide the signal paths based on number 5 into five groups connecting to shorting bars 83 wherein the 1st, 6th, 11th . . . , and etc. signal paths 821 are the first group; the 2nd, 7th, 12th . . . , and etc. signal paths 822 are the second group; the 3rd, 8th, 13th . . . , and etc. signal paths 823 are the third group; the 4th, 9th, 14th . . . , and etc. signal paths 824 are the fourth group; the 5th, 10th, 15th . . . , and etc. signal paths 825 are the fifth group. The LCD testing circuit according to the present invention further comprises a plurality of gate signal paths 84 on the substrate connecting to the corresponding pixels 811, two gate shorting bars 85 on the substrate each of them connecting to the odd number gate signal paths 841 and even number gate signal paths 842 respectively and testing pads 831, 851 for coupling with probes of testing equipments connecting to terminals of gate shorting bars 85 and terminals of shorting bars 83. While doing the testing, testing equipments send testing signals by coupling a plurality of testing probes with corresponding testing pads 831, 851 into shorting bars 83 and gate shorting bars 85.

With the detail description of the embodiments according to the present invention mentioned above, there is provided a testing circuit able to improve the efficiency of both array testing and liquid crystal cells of an LCD. Although the depiction is about several examples with specific number pixels of a pixel cell, an LCD with any number of pixels of a pixel cell can apply this methodology according to the invention, too.

While the present invention has been described in detail, it is not limited to such details since any modifications and changes may be made to those of skill in the art without departing from the spirit and scope of the invention. The features and advantages of the present invention will become apparent from the appended claims.

What is claimed is:

1. A testing circuit for an LCD apparatus, comprising:

a substrate;

a plurality of arrayed pixel cells on said substrate wherein each pixel cell contains n subpixels;

a plurality of signal paths on said substrate coupled with said subpixels; and p shorting bars on said substrate wherein the p shorting bars connect to the (p×m+1)th, (p×m+2)th, (p×m+3)th . . . , (p×m+p)th subpixel signal paths where p=(r+1)×n, wherein r=1 when n is an odd integer, and r=0 when n is an even integer, and where m is a positive integer or zero;

each of said p shorting bars connecting to corresponding ones of said subpixel signal paths in each of said arrayed pixel cells.

2. The testing circuit according to claim 1, wherein the substrate is a glass substrate.

3. The testing circuit according to claim 1, wherein the substrate is a flexible substrate.

4. The testing circuit according to claim 1, further comprising a plurality of testing pads on said substrate coupled with said shorting bars.

5. The testing circuit according to claim 1, further comprising a plurality of gate signal paths on said substrate coupled with said pixels.

6. The testing circuit of an LCD apparatus according to claim 5, further comprising two gate shorting bars, one connecting to said gate signal paths with odd sequential number and the other connecting to said gate signal pats with even sequential number.

7. The testing circuit according to claim 1, further comprising a first collecting shorting bar and a second collecting shorting bar on said substrate.

8. The testing circuit according to claim 7, wherein said p shorting bars with odd sequential number are selectively grouped to connect to one of said collecting shorting bars and said p shorting bars with even sequential number are selectively grouped to connect to another one of said collecting shorting bars.

9. The testing circuit according to claim 1, wherein said p shorting bars in a pixel cell testing configuration are selectively grouped into n groups for collective actuation according to group, and said p shorting bars in a short defect testing configuration are selectively grouped into two even groups respectively connected to alternating subpixel signal paths of said arrayed pixel cells for collective actuation according to group.

* * * * *